(12) United States Patent
Hsiao et al.

(10) Patent No.: US 11,348,889 B2
(45) Date of Patent: *May 31, 2022

(54) SEMICONDUCTOR DEVICE AND BUMP FORMATION PROCESS

(71) Applicant: Taiwan Semiconductor Manufacturing Company, Ltd., Hsinchu (TW)

(72) Inventors: Yi-Li Hsiao, Hsinchu (TW); Chen-Hua Yu, Hsinchu (TW); Shin-Puu Jeng, Hsinchu (TW); Chih-Hang Tung, Hsinchu (TW); Cheng-Chang Wei, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/722,357

(22) Filed: Dec. 20, 2019

(65) Prior Publication Data

US 2020/0126937 A1     Apr. 23, 2020

Related U.S. Application Data

(60) Continuation of application No. 15/966,934, filed on Apr. 30, 2018, now Pat. No. 10,522,491, which is a
(Continued)

(51) Int. Cl.
*H01L 23/52* (2006.01)
*H01L 23/00* (2006.01)
(Continued)

(52) U.S. Cl.
CPC .............. *H01L 24/11* (2013.01); *H01L 21/44* (2013.01); *H01L 21/76885* (2013.01);
(Continued)

(58) Field of Classification Search
CPC .... H01L 23/52; H01L 23/49811; H01L 24/11; H01L 24/05; H01L 24/13; H01L 21/44;
(Continued)

(56) References Cited

U.S. PATENT DOCUMENTS 4,783,722 A * 11/1988 Osaki ...................... H01L 24/16
361/779
5,130,779 A     7/1992 Agarwala et al.
(Continued)

FOREIGN PATENT DOCUMENTS

JP     2007188943 A     7/2007
TW     523871 B     3/2003

OTHER PUBLICATIONS

Kloeser, J., et al., "High-performance flip chip packages with copper pillar bumping," Global SMT & Packaging, May 2006, pp. 28-31.
(Continued)

*Primary Examiner* — Eugene Lee
(74) *Attorney, Agent, or Firm* — Slater Matsil, LLP

(57) ABSTRACT

A semiconductor device includes a solder bump overlying and electrically connected to a pad region, and a metal cap layer formed on at least a portion of the solder bump. The metal cap layer has a melting temperature greater than the melting temperature of the solder bump.

20 Claims, 11 Drawing Sheets

Related U.S. Application Data division of application No. 15/269,212, filed on Sep. 19, 2016, now Pat. No. 9,960,134, which is a division of application No. 13/787,670, filed on Mar. 6, 2013, now Pat. No. 9,455,183, which is a division of application No. 12/883,950, filed on Sep. 16, 2010, now abandoned.

(60) Provisional application No. 61/301,456, filed on Feb. 4, 2010.

(51) Int. Cl.
*H01L 21/44* (2006.01)
*H01L 21/768* (2006.01)
*H01L 23/498* (2006.01)

(52) U.S. Cl.
CPC ........ *H01L 23/49811* (2013.01); *H01L 23/52* (2013.01); *H01L 24/05* (2013.01); *H01L 24/13* (2013.01); *H01L 24/03* (2013.01); *H01L 2224/0347* (2013.01); *H01L 2224/0361* (2013.01); *H01L 2224/03912* (2013.01); *H01L 2224/10126* (2013.01); *H01L 2224/10145* (2013.01); *H01L 2224/11* (2013.01); *H01L 2224/1147* (2013.01); *H01L 2224/11823* (2013.01); *H01L 2224/11825* (2013.01); *H01L 2224/11849* (2013.01); *H01L 2224/13018* (2013.01); *H01L 2224/13562* (2013.01); *H01L 2224/13565* (2013.01); *H01L 2224/80815* (2013.01); *H01L 2224/81815* (2013.01); *H01L 2924/01322* (2013.01); *H01L 2924/1305* (2013.01); *H01L 2924/1306* (2013.01); *H01L 2924/13091* (2013.01); *H01L 2924/14* (2013.01)

(58) Field of Classification Search
CPC ..... H01L 21/76885; H01L 2224/11849; H01L 2224/0347; H01L 2224/0361; H01L 2224/03912; H01L 2224/11825; H01L 2224/11823; H01L 2224/13565; H01L 24/03; H01L 2224/1147; H01L 2224/13018; H01L 2224/80815; H01L 2224/81815; H01L 2924/14; H01L 2224/13562; H01L 2924/01322; H01L 2224/10145; H01L 2224/10126; H01L 2224/11; H01L 2924/1305; H01L 2924/1306; H01L 2924/13091
See application file for complete search history.

(56) References Cited

U.S. PATENT DOCUMENTS

| | | | |
|---|---|---|---|
| 5,376,584 A | 12/1994 | Agarwala | |
| 5,656,858 A * | 8/1997 | Kondo | H01L 24/03 257/737 |
| 5,834,366 A | 11/1998 | Akram | |
| 5,937,320 A | 8/1999 | Andricacos et al. | |
| 6,095,397 A | 8/2000 | Wolf et al. | |
| 6,127,731 A | 10/2000 | Hoffmeyer | |
| 6,204,558 B1 | 3/2001 | Yanagida | |
| 6,225,206 B1 | 5/2001 | Jimarez et al. | |
| 6,293,457 B1 | 9/2001 | Srivastava et al. | |
| 6,300,164 B1 | 10/2001 | Call et al. | |
| 6,332,988 B1 | 12/2001 | Berger, Jr. et al. | |
| 6,471,115 B1 | 10/2002 | Ijuin et al. | |
| 6,495,397 B2 | 12/2002 | Kubota et al. | |
| 6,541,366 B1 | 1/2003 | Chin et al. | |
| 6,639,314 B2 | 10/2003 | Boettcher et al. | |
| 6,683,375 B2 * | 1/2004 | Joshi | H01L 24/11 257/690 |
| 6,712,260 B1 | 3/2004 | Kuo et al. | |
| 6,727,586 B2 | 4/2004 | Frankowsky et al. | |
| 6,798,050 B1 | 9/2004 | Homma et al. | |
| 6,818,545 B2 | 11/2004 | Lee et al. | |
| 7,008,867 B2 * | 3/2006 | Lei | H01L 24/03 257/E21.508 |
| 7,119,002 B2 | 10/2006 | Lin | |
| 7,176,583 B2 | 2/2007 | Daubenspeck et al. | |
| 7,276,801 B2 * | 10/2007 | Dubin | H01L 21/288 257/779 |
| 7,358,174 B2 | 4/2008 | Mis | |
| 7,449,406 B2 | 11/2008 | Nishiyama et al. | |
| 7,462,556 B2 | 12/2008 | Wang | |
| 7,728,431 B2 | 6/2010 | Harada et al. | |
| 7,838,954 B2 * | 11/2010 | Buchwalter | B23K 1/0016 257/437 |
| 7,915,741 B2 * | 3/2011 | Lau | H01L 24/05 257/780 |
| 8,334,594 B2 | 12/2012 | Lo et al. | |
| 8,759,958 B2 * | 6/2014 | Ho | H01L 25/03 257/686 |
| 9,455,183 B2 * | 9/2016 | Hsiao | H01L 24/05 |
| 9,496,189 B2 | 11/2016 | Yu et al. | |
| 9,960,134 B2 | 5/2018 | Hsiao et al. | |
| 2001/0013423 A1 | 8/2001 | Dalal et al. | |
| 2003/0006062 A1 | 1/2003 | Stone et al. | |
| 2003/0080420 A1 | 5/2003 | Ohara | |
| 2003/0127734 A1 * | 7/2003 | Lee | H01L 24/13 257/737 |
| 2003/0134233 A1 | 7/2003 | Su et al. | |
| 2003/0151140 A1 | 8/2003 | Nishiyama et al. | |
| 2003/0193094 A1 | 10/2003 | Takahashi et al. | |
| 2003/0219966 A1 * | 11/2003 | Jin | H01L 24/13 438/612 |
| 2004/0007779 A1 | 1/2004 | Arbuthnot et al. | |
| 2004/0262778 A1 | 12/2004 | Hua | |
| 2005/0012211 A1 * | 1/2005 | Kung | H01L 24/11 257/734 |
| 2005/0032349 A1 | 2/2005 | Lee et al. | |
| 2007/0075410 A1 | 4/2007 | Chan et al. | |
| 2007/0166993 A1 | 7/2007 | Lee et al. | |
| 2007/0167004 A1 | 7/2007 | Trezza | |
| 2008/0227237 A1 | 9/2008 | Lin et al. | |
| 2010/0007019 A1 | 1/2010 | Pendse | |
| 2010/0109159 A1 | 5/2010 | Ho et al. | |

OTHER PUBLICATIONS

Korhonen, T-M., et al., "Interconnections Based on Bi-Coated SnAg Solder Balls"; IEEE Transactions on Advanced Packaging, vol. 24, No. 4, Nov. 2001, pp. 515-520.

\* cited by examiner

SEMICONDUCTOR DEVICE AND BUMP FORMATION PROCESS

PRIORITY CLAIM AND CROSS-REFERENCE

This application is a continuation of U.S. patent application Ser. No. 15/966,934, filed on Apr. 30, 2018 and entitled "Semiconductor Device and Bump Formation Process," which is a divisional of U.S. patent application Ser. No. 15/269,212 filed on Sep. 19, 2016, entitled "Semiconductor Device and Bump Formation Process," now U.S. Pat. No. 9,960,134 issued on May 1, 2018, which is a divisional of U.S. patent application Ser. No. 13/787,670 filed on Mar. 6, 2013, entitled "Semiconductor Device and Bump Formation Process," now U.S. Pat. No. 9,455,183 issued on Sep. 27, 2016, which is a divisional of U.S. patent application Ser. No. 12/883,950 filed on Sep. 16, 2010, entitled "Semiconductor Device and Bump Formation Process," which application further claims the benefit of U.S. Provisional Application No. 61/301,456 filed on Feb. 4, 2010, entitled "Fine Pitch Solder Bumps and Process For Making Same," which applications are hereby incorporated herein by reference.

TECHNICAL FIELD

This disclosure relates to semiconductor devices, and more particularly, to the fabrication of bump structures in semiconductor devices.

BACKGROUND

Modern integrated circuits are made up of literally millions of active and/or passive devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. In a typical bumping process, interconnect structures are formed on metallization layers, followed by the formation of under-bump metallurgy (UBM) and solder balls. Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in that order, on the I/O pad. The bumps themselves, based on the material used, are classified as solder bumps, gold bumps, copper pillar bumps and bumps with mixed metals.

Usually, a material used for the solder alloy is so-called Sn—Pb eutectic solder of Sn-38 mass % Pb. Recently the semiconductor industry has been moving to "lead (Pb) free" packaging and lead-free device connector technology. This trend increasingly results in the use of lead free solder bumps and lead free solder balls to form connections with integrated circuits and packages. The use of lead free solder is safer for the environment, safer for workers in the industry and safer for consumers than lead based solder bumps or solder balls. However, the quality and reliability of the solder bumps has not always been as great as desired. For finer pitches and larger interconnect densities, the risk of shorts occurring between solder bumps during fabrication and flip-chip assembly is high.

DETAILED DESCRIPTION

This disclosure provides bump formation processes used in semiconductor devices applied to flip-chip assembly, wafer-level chip scale package (WLCSP), three-dimensional integrated circuit (3D-IC) stack, and/or any advanced package technology fields. Embodiments described herein relate to methods of forming solder bumps for use with semiconductor devices. In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1A-1G are cross-sectional views of a portion of a semiconductor device at various stages in a bump formation process in accordance with an exemplary embodiment.

Figure 1A:
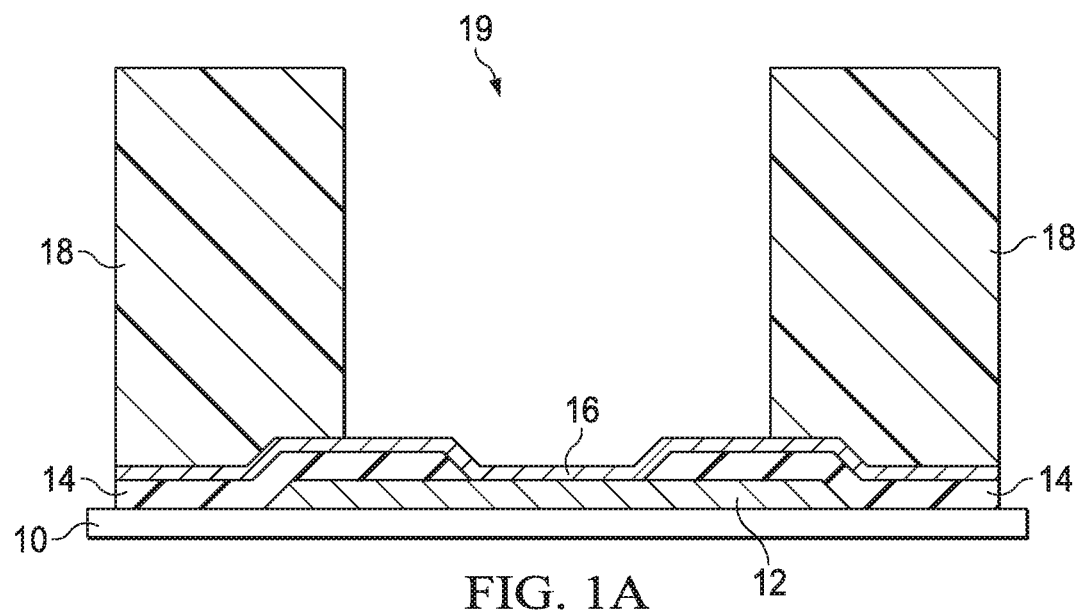
FIGS. 1A-1G are cross-sectional views of a portion of a semiconductor device at various stages in a bump formation process in accordance with an embodiment.

With reference to FIG. 1A, an exemplary semiconductor substrate 10 used for bump fabrication is employed in a semiconductor device fabrication, and integrated circuits may be formed therein and/or thereupon. The semiconductor substrate 10 is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), resistors, diodes, capacitors, inductors, fuses, or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers.

FIG. 1A depicts a conductive region 12 and a passivation layer 14 formed on the substrate 10. The conductive region 12 is a metallization layer formed over the inter-layer dielectric layers. The conductive region 12 is a portion of conductive routes and has an exposed surface treated by a planarization process, such as chemical mechanical polishing (CMP), if necessary. Suitable materials for the conductive region 12 may include, but are not limited to, for example copper, aluminum, copper alloy, or other mobile conductive materials, although it may also be formed of, or include, other materials such as copper, silver, gold, nickel, tungsten, alloys thereof, and/or multi-layers thereof. In one embodiment, the conductive region 12 is a pad region 12, which may be used in the bonding process to connect the integrated circuits in the respective chip to external features. The passivation layer 14 is formed on the substrate 10, overlying the pad region 12. Using photolithography and etching processes, the passivation layer 14 is patterned to form an opening exposing a portion of the conductive region 12. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used.

FIG. 1A also depicts the formation of an under-bump-metallurgy (UBM) layer 16 on the passivation layer 14, electrically connected to the pad region 12. The UBM layer 16 is formed on the passivation layer 14 and the exposed portion of the conductive region 12. In an embodiment, the UBM layer 16 includes a diffusion barrier layer and/or a seed layer. The diffusion barrier layer, also referred to as a glue layer, is formed to cover the sidewalls and the bottom of the opening of the passivation layer 14. The diffusion barrier layer may be formed of titanium, although it may also be formed of other materials such as titanium nitride, tantalum, tantalum nitride, or the like. The formation methods include physical vapor deposition (PVD) or sputtering. The seed layer may be a copper seed layer formed on the diffusion barrier layer using PVD or sputtering. The seed layer may be formed of copper alloys that include silver, chromium, nickel, tin, gold, or combinations thereof. In one embodiment, the UBM layer 16 is a Cu/Ti layer. The diffusion barrier layer may have a thickness about 1000-2000 Angstroms, and the seed layer may have a thickness equal to about 3000-7000 Angstroms, although their thicknesses may also be greater or smaller. The dimensions recited throughout the description are merely examples, and will be scaled with the downscaling of integrated circuits.

FIG. 1A further depicts the formation a mask layer 18 provided on the UBM layer 16 and patterned with an opening 19 for example, by exposure, development or etching, so that a portion of the UBM layer 16 is exposed for bump formation. The mask layer 18 may be a dry film or a photoresist film. In an embodiment, the mask layer 18 is a dry film, and may be formed of an organic material such as Ajinimoto buildup film (ABF). In alternative embodiments, the mask layer 18 is formed of a photo resist. The thickness of the mask layer 18 may be greater than about 5 μm, or even between about 10 μm and about 120 μm.

Figure 1B:
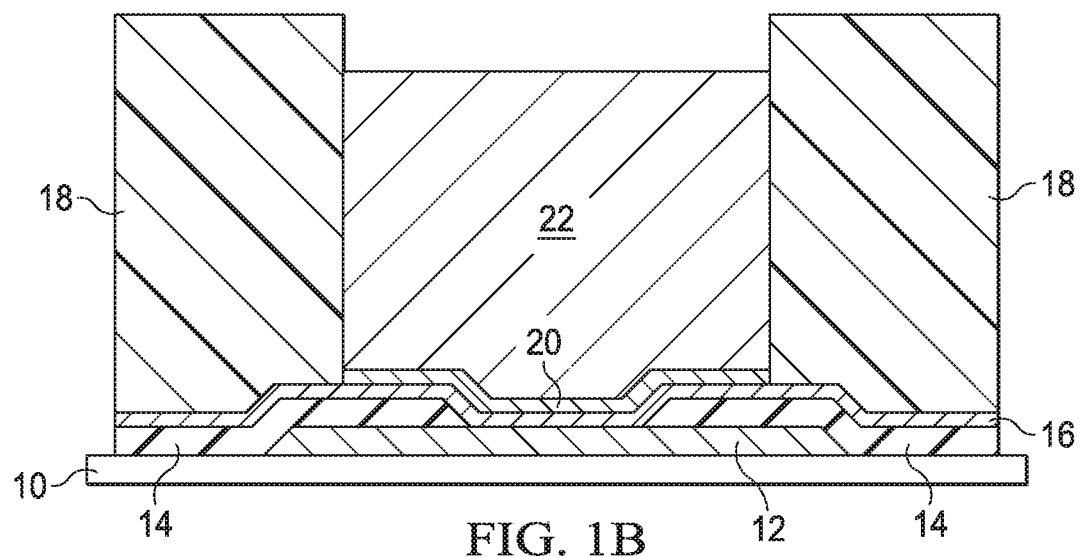

Referring to FIG. 1B, a solder material layer 22 is formed over the UBM layer 16 within the opening 19 of the mask layer 18. The solder material layer 22 is made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. In one embodiment, the solder material layer 22 is a lead-free solder material layer. In some embodiments, an optional metallization layer 20 is deposited in the opening 19 before the formation of the solder material layer 22. The optional metallization layer 20 has a thickness less than 10 um. In some embodiments, the optional metallization layer 20 has a thickness about 1-10 μm, for example about 4-8 μm, although the thickness may be greater or smaller. The formation method of the metallization layer 20 may include electro plating methods. In one embodiment, the optional metallization layer 20 includes a copper layer, a copper alloy layer, a nickel layer, a nickel alloy layer, or combinations thereof. In some embodiments, the optional metallization layer 20 includes gold (Au), silver, palladium (Pd), indium (In), nickel-palladium-gold (NiPdAu), nickel-gold (NiAu) or other similar materials or alloy.

Figure 1C:
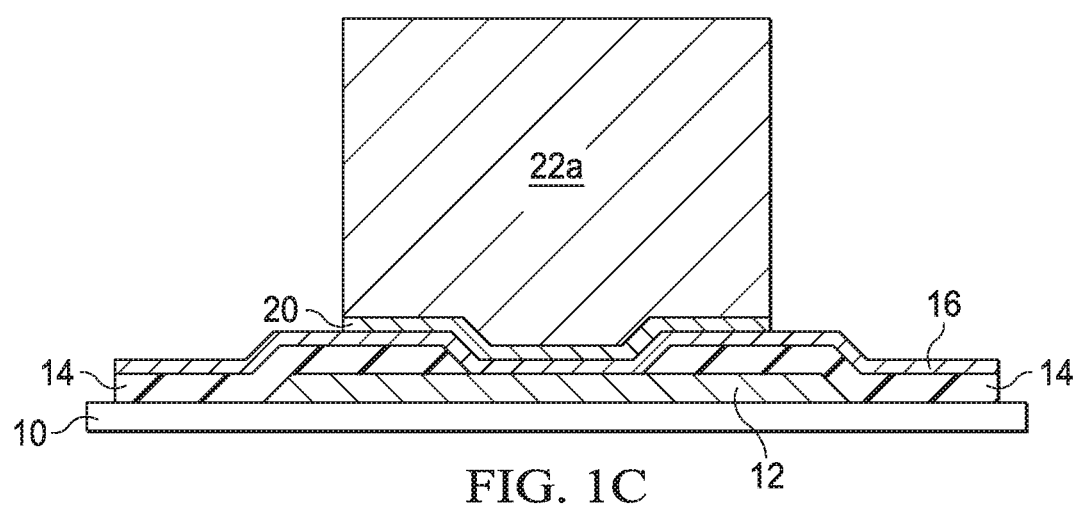
Figure 1D:
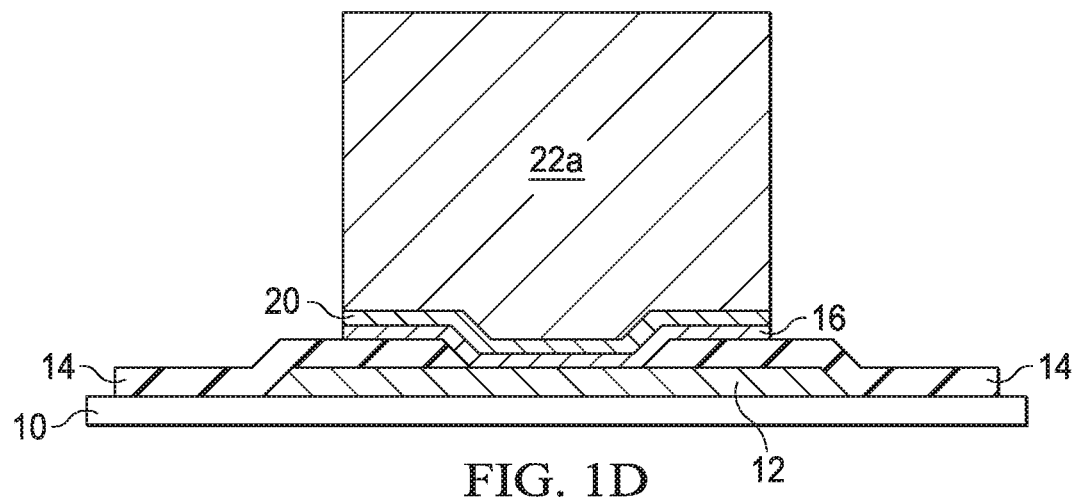

Next, the mask layer 18 is removed as shown in FIG. 1C. In the case the mask layer 18 is a dry film, it may be removed using an alkaline solution. If the mask layer 18 is formed of photoresist, it may be removed by a wet stripping process using acetone, n-methyl pyrrolidone (NMP), dimethyl sulfoxide (DMSO), aminoethoxy ethanol, and the like. Thus, the uncovered portions of the UBM layer 16 are exposed, and the solder material layer 22 becomes a solder pillar 22a. In an embodiment, the thickness of the solder pillar 22a is greater than 40 um. In other embodiments, the thickness of the solder pillar 22a is about 40-70 μm, although the thickness may be greater or smaller. Next, as shown in FIG. 1D, uncovered portions of the UBM layer 16 are removed to expose the underlying passivation layer 14 by etching methods, such as wet etching, dry etching or the like.

Figure 1E:
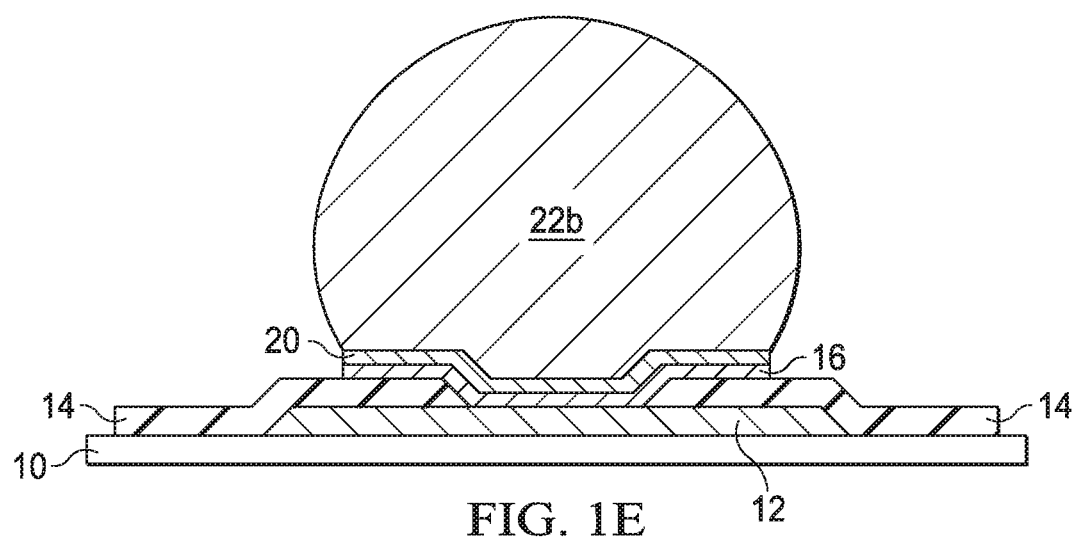

FIG. 1E depicts a thermal reflow process performed on the solder pillar 22a, forming a ball-shaped solder bump 22b. During thermal cycling, an intermetallic compound (IMC) layer may be formed between the solder bump 22b and the optional metallization layer 20. The optional metallization layer 20 may be consumed during the IMC formation.

Figure 1F:
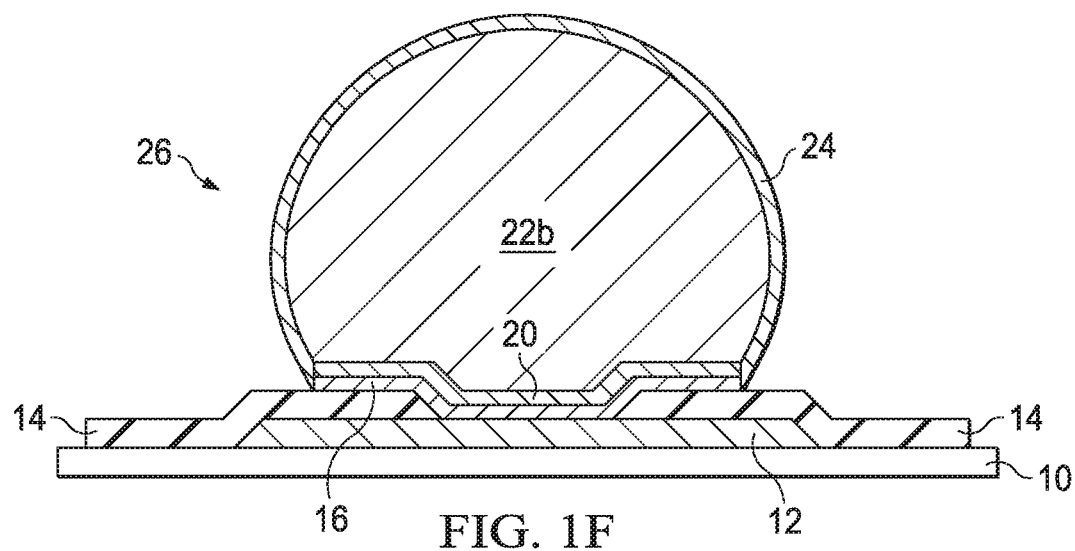

With reference to FIG. 1F, a metal cap layer 24 is formed on at least an exposed portion of the solder bump 22b. In one embodiment, the metal cap layer 24 is formed on the entire surface of the solder bump 22b. In other embodiments, the metal cap layer 24 extends to cover the surface of the optional metallization layer 20 and the UBM layer 16. The metal cap layer 24 is a metal material layer with a melting temperature greater than the melting temperature of the solder material layer 22. In some embodiments, the metal cap layer 24 is formed of copper, nickel (Ni), gold (Au), silver (Ag), palladium (Pd), indium (In), nickel-palladium-gold (NiPdAu), nickel-gold (NiAu), other similar materials, or alloy. In some embodiments, the metal cap layer 24 may further include many other conductive materials used in semiconductor packaging such as indium (In), platinum (Pt), cobalt (Co), vanadium (V), and their alloys. In one embodiment, the metal cap layer 24 has a thickness about 0.02 μm-5 μm, although the thickness may be greater or smaller. The metal cap layer 24 may be a single-layered structure or a multi-layered structure. FIG. 1H illustrates a similar cross-sectional view as FIG. 1F, but with a multi-layered structure for the metal cap layer 24. The number of layers for the metal cap layer 24 illustrated in FIG. 1H is merely a non-limiting example. Other numbers of layers are also possible and are fully intended to be included within the scope of the present disclosure. In subsequent figures, the multi-layered structure for the metal cap layer 24 may not be illustrated, with the understanding that the metal cap layer 24 may have a multi-layered structure same as or similar to that of FIG. 1H. In an embodiment, the metal cap layer 24 is deposited by electroless or immersion metal deposition process, for example an ENEPIG structure (a stack of an electroless nickel (Ni)/electroless palladium (Pd)/immersion gold (Au) layers), an ENEP structure (a stack of an electroless nickel (Ni)/electroless palladium (Pd) layers), and EN layer (an electroless nickel (Ni) layer), an ENIG structure (a stack of an electroless nickel (Ni)/immersion gold (Au) layers), or combinations thereof.

This completes a bump structure 26 including the UBM layer 16, the optional metallization layer 20, the solder bump 22b and the metal cap layer 24. The bump structure 26 of the embodiments may be various sizes in diameter and may include so-called "micro-bumps". For example, the bump structure may be 65-80 microns in diameter. The pitch between bump structures may be less than 150 microns, such as 130-140 microns, and may in the future get even smaller. For micro-bump applications, the pitch may be 20-50 microns, and the diameter may be between 10-25 microns as well. The resulting bump structure 26 has a portion that is covered with the metal cap layer 24 that is harder, and has a higher melting point, than the solder bump 22b. The metal cap layer 24 causes the solder bump 22b to act as a spring or act like an air filled balloon when subsequently pushed against a substrate, that is, the bump structure 26 can resist deformation. In some ways, the metal cap layer 24 acts as a hard stop. The bump structure 26 can maintain a more uniform stand off height in completed packages, and the shorting and bridging problems are reduced or eliminated.

Figure 1G:
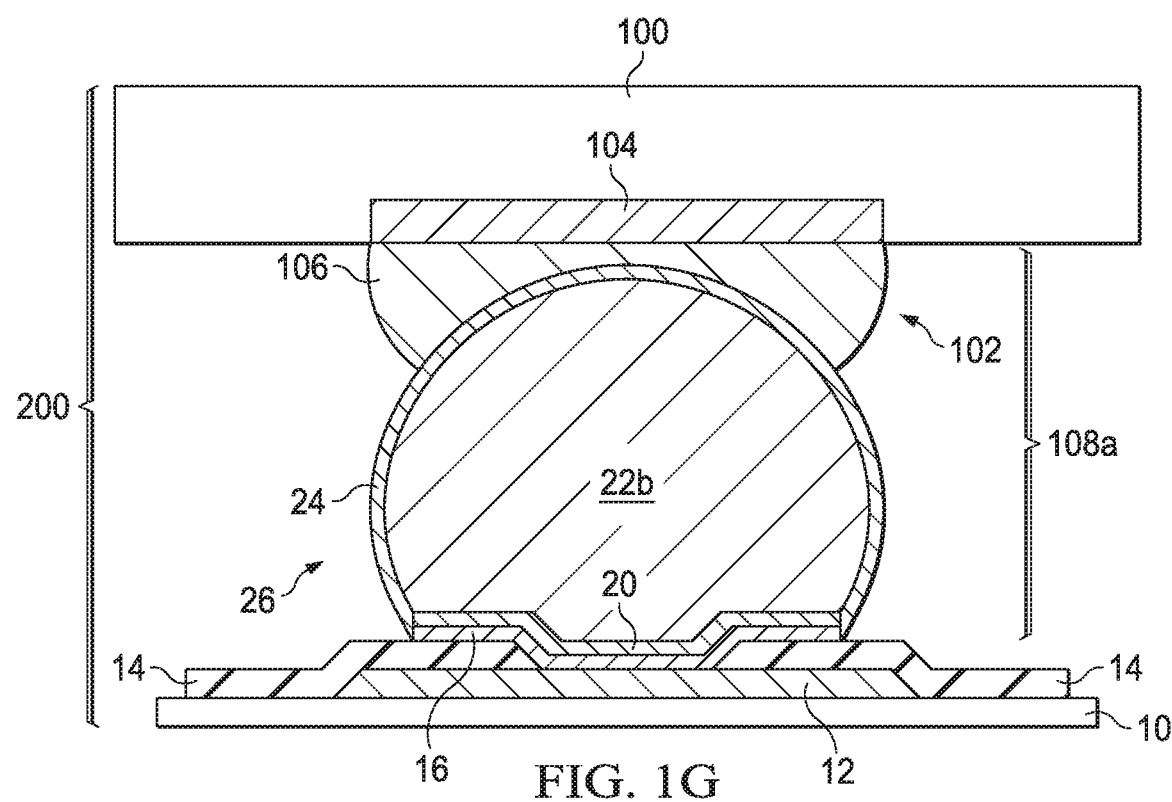
Figure 1H:
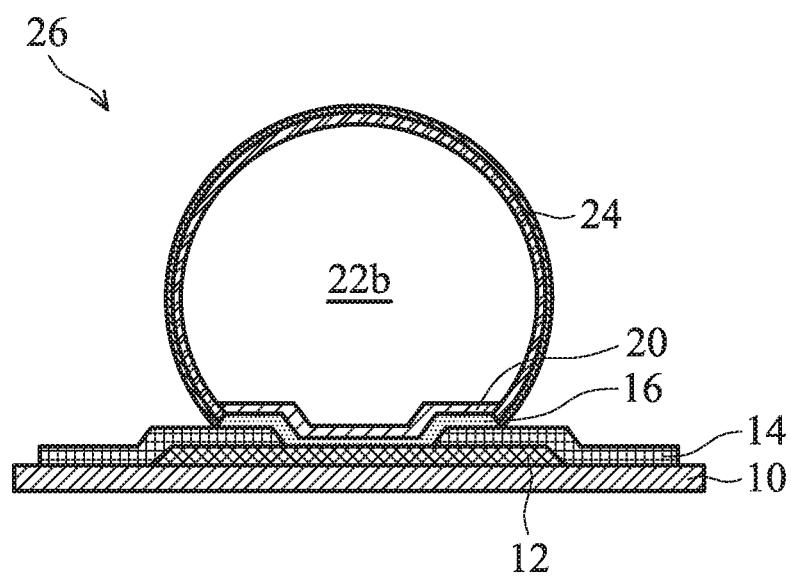
FIG. 1H is a cross-sectional view of a portion of a semiconductor device at certain stage in a bump formation process in accordance with an embodiment.

FIG. 1G is a cross-sectional diagram depicting an embodiment of a package assembly with the bump structure 26. After the formation of the bump structure 26, the substrate 10 may then be sawed and packaged onto a package substrate, or another die, with solder balls or Cu posts mounted on a pad on the package substrate or the other die. The structure shown in FIG. 1F is attached to another substrate 100. The substrate 100 may be a package substrate, board (e.g., a print circuit board (PCB)), or other suitable substrate. The connection structure 102 contacts the substrate 100 at various conductive attachment points, for example, a solder layer 106 on contact pads 104 and/or conductive traces. The solder layer 106 may be a eutectic solder material including alloys of tin, lead, silver, copper, nickel, bismuth, or combinations thereof. Using an exemplary coupling process including a flux application, chip placement, thermally reflowing of melting solder joints, and cleaning of flux residue, a joint-solder structure 108 is formed between the substrates 10 and 100. The substrate 10, the joint-solder layer 108a, and the other substrate 100 is referred to as a packaging assembly 200, or in the present embodiment, a flip-chip assembly. In some embodiments, after thermal cycles during package assembly process, the metal cap layer 24 may react with the solder bump 22b and/or the solder layer 106, resulting in an intermetallic compound (IMC) within the joint-solder structure 108a. Also, the metal elements in the metal cap layer 24 may diffuse into the solder bump 22b and/or the solder layer 106 after thermal cycles. The metal cap layer 24 may be partially consumed during the IMC formation. It is discovered that the use of the metal cap layer 24 on the solder bump 22b maintains a more uniform stand off height in completed packages, and improved reliability of the semiconductor device.

Figure 2A:
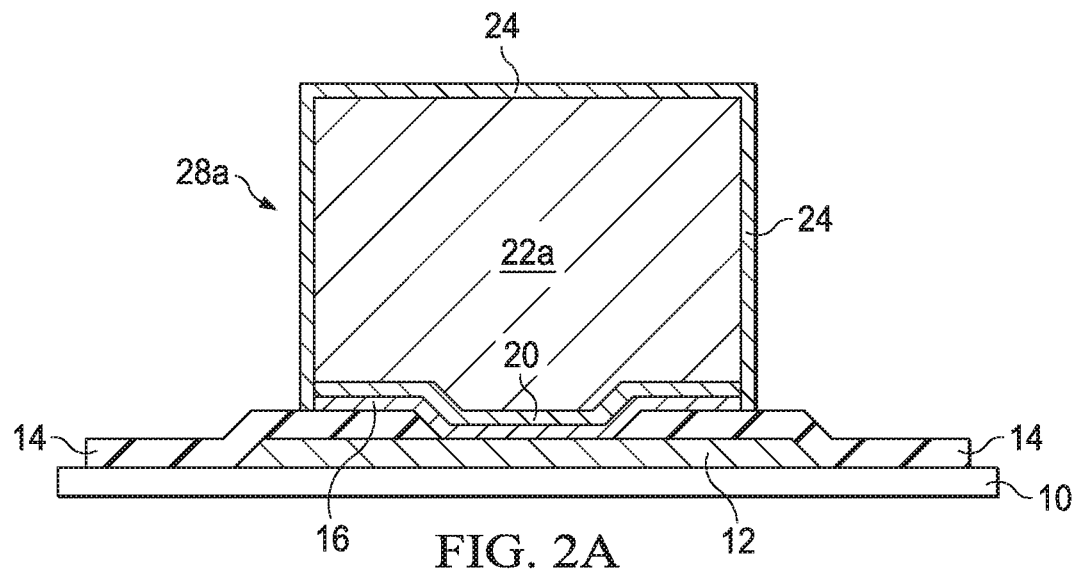
FIGS. 2A-2C are cross-sectional views of a portion of a semiconductor device at various stages in a bump formation process in accordance with an embodiment.
Figure 2B:
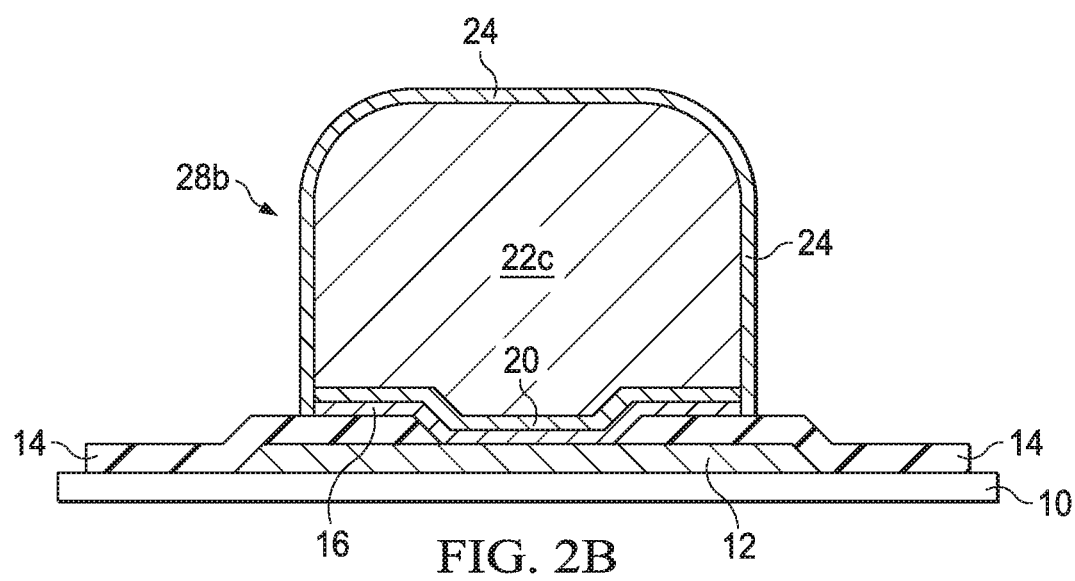
Figure 2C:
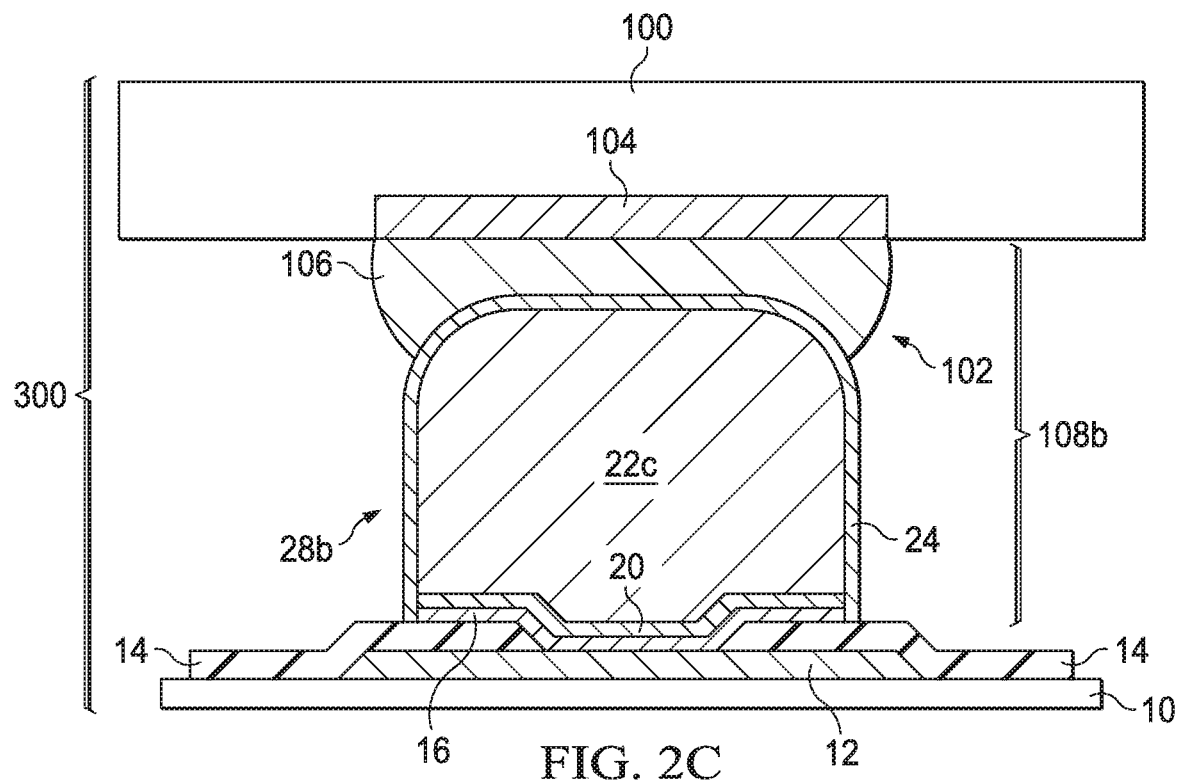

FIGS. 2A-2C are cross-sectional views of a portion of a semiconductor device at various stages in a bump formation process in accordance with embodiments. The explanation of the same or similar portions to the description in FIG. 1A to FIG. 1G will be omitted.

With reference to FIG. 2A, after the UBM etching process, the resulting structure as shown in FIG. 1D proceeds to the formation of the metal cap layer 24. That is, the metal cap layer 24 is formed on the solder pillar 22a before performing a solder thermal reflow process. In one embodiment, the metal cap layer 24 is formed on the entire surface of the solder pillar 22a by electroless or immersion metal deposition process. In some embodiments, the metal cap layer 24 extends to cover a portion of the optional metallization layer 20 and the UBM layer 16. This completes a bump structure 28a including the UBM layer 16, the optional metallization layer 20, the solder pillar 22a and the metal cap layer 24. The metal cap layer 24 causes the solder pillar 22a to act as a spring or act like an air filled balloon when subsequently pushed against a substrate. The metal cap layer 24 acts as a hard stop to make the bump structure 28a maintain a more uniform stand off height in completed packages. The shorting and bridging problems are therefore reduced or eliminated.

In an alternative embodiment, the bump structure 28a proceeds to a solder thermal reflow process. With reference to FIG. 2B, the solder pillar 22a is thermally reflowed to shape the pillar into a rounded solder bump 22c. In one embodiment, the solder bump 22c includes a rounded corner in a cross-sectional view. Also, the metal elements in the metal cap layer 24 may diffuse into the solder bump 22c after thermal cycles. This completes another bump structure 28b including the UBM layer 16, the optional metallization layer 20, the rounded solder bump 22c and the metal cap layer 24. The metal cap layer 24 causes the solder bump 22c to act as a spring or act like an air filled balloon when subsequently pushed against a substrate. The metal cap layer 24 acts as a hard stop to make the bump structure 28b maintain a more uniform stand off height in completed packages. The shorting and bridging problems are therefore reduced or eliminated.

FIG. 2C is a cross-sectional diagram depicting an embodiment of a package assembly with the bump structure 28b. After the formation of the bump structure 28a or 28b, the substrate 10 may then be sawed and packaged to another substrate 100 through the connection structure 102 including a solder layer 106 on contact pads 104 and/or conductive traces. Using an exemplary coupling process, a joint-solder structure 108b is formed between the substrates 10 and 100. The substrate 10, the joint-solder layer 108b, and the other substrate 100 is referred to as a packaging assembly 300. In the case of forming the bump structure 28a on the substrate 10, the solder pillar 22a is thermally reflowed to shape the pillar into a rounded solder bump 22c during the coupling process, and thereby the bump structure 28 becomes the bump structure 28b in the packaging assembly 300. Also, the metal elements in the metal cap layer 24 may diffuse into the solder bump 22c and/or the solder layer 106 after thermal cycles. It is discovered that the use of the metal cap layer 24 of the bump structure 28a or 28b maintains a more uniform stand off height in completed packages, and improved reliability of the semiconductor device.

FIGS. 3A-3D are cross-sectional views of a portion of a semiconductor device at various stages in a bump formation process in accordance with an embodiment. The explanation of the same or similar portions to the description in FIG. 1A to FIG. 1G will be omitted.

Figure 3A:
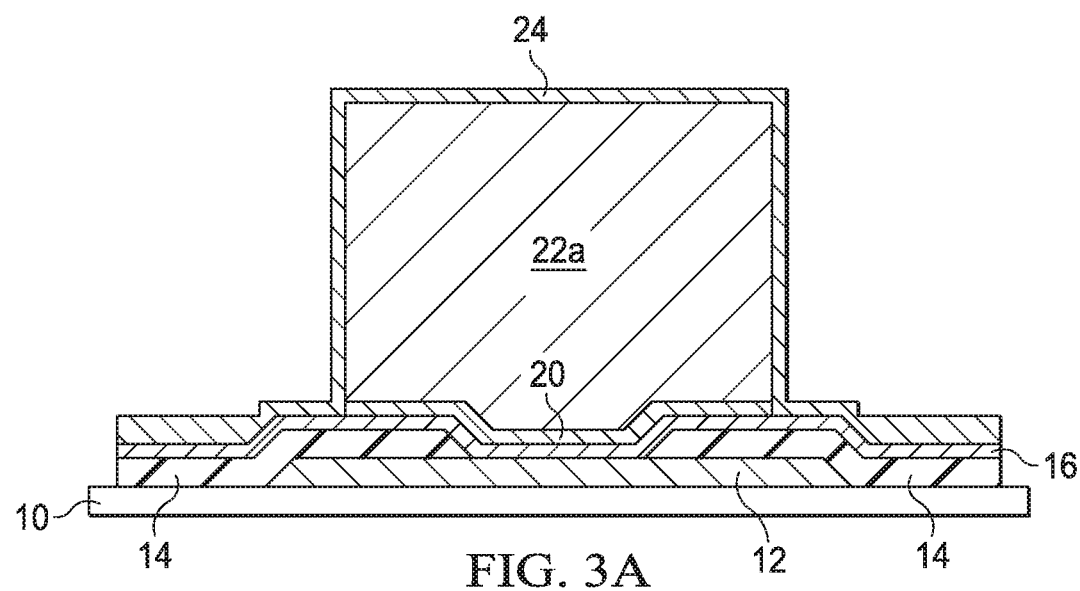
FIGS. 3A-3D are cross-sectional views of a portion of a semiconductor device at various stages in a bump formation process in accordance with an embodiment.

With reference to FIG. 3A, after removing the mask layer, the resulting structure as shown in FIG. 1C proceeds to the formation of the metal cap layer 24. That is, the metal cap layer 24 is formed on the solder pillar 22a and the uncovered portions of the UBM layer 16 before performing an UBM etching process. In one embodiment, the metal cap layer 24 is formed on the entire surface of the solder pillar 22a by electro plating, electroless plating, or chemical vapor deposition (CVD) methods.

Figure 3B:
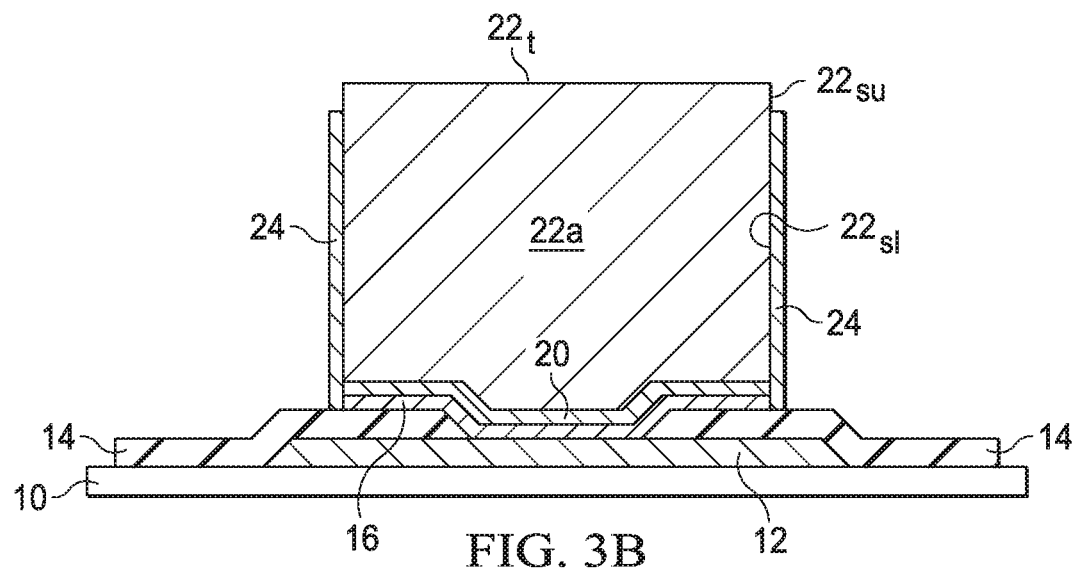

Next, as shown in FIG. 3B, an etching process, such as wet etching, dry etching or the like, is performed in order to remove the UBM layer 16 outside the solder pillar 22a till the passivation layer 14 is exposed. The metal cap layer 24 and the UBM layer 16 outside the solder pillar 22a are removed in the etching process, and a portion of the metal cap layer 24 on the surface of the solder pillar 22a is also removed. In one embodiment, a portion of the metal cap layer 24 on the top of the solder pillar 22a is removed to expose the top surface 22t of the solder pillar 22a. In some embodiments, a portion of the metal cap layer 24 adjacent to the upper sidewall of the solder pillar 22a is removed to expose the upper sidewall surface $22s_u$ of the solder pillar 22a. The metal cap layer 24 remains on the lower sidewall surface $22s_L$ of the solder pillar 22a.

Figure 3C:
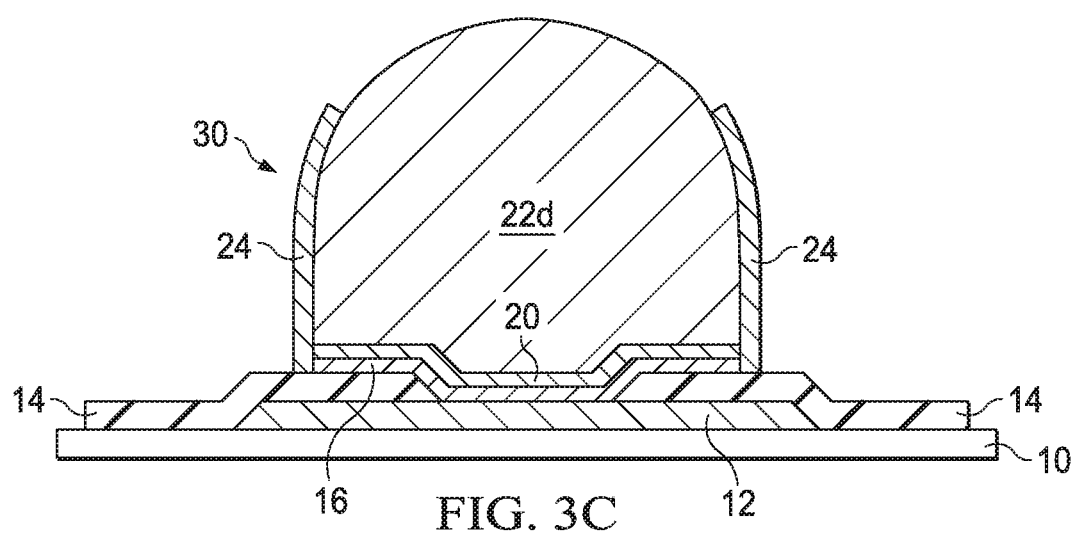

FIG. 3C depicts a thermal reflow process performed on the solder pillar 22a, forming a surface-rounded solder bump 22d. During thermal cycling, the metal elements of the metal cap layer 24 may diffuse into the solder bump 22d, and an intermetallic compound (IMC) layer may be formed between the solder bump 22d and the metal cap layer 24. This completes a bump structure 30 including the UBM layer 16, the optional metallization layer 20, the solder bump 22d and the metal cap layer 24. The metal cap layer 24 remains on the lower sidewall surface $22s_L$ of the solder bump 22d. The metal cap layer 24 causes the solder bump 22d to act as a spring or act like an air filled balloon when subsequently pushed against a substrate. The metal cap layer 24 acts as a hard stop to make the bump structure 28a maintain a more uniform stand off height in completed packages. The shorting and bridging problems are therefore reduced or eliminated.

Figure 3D:
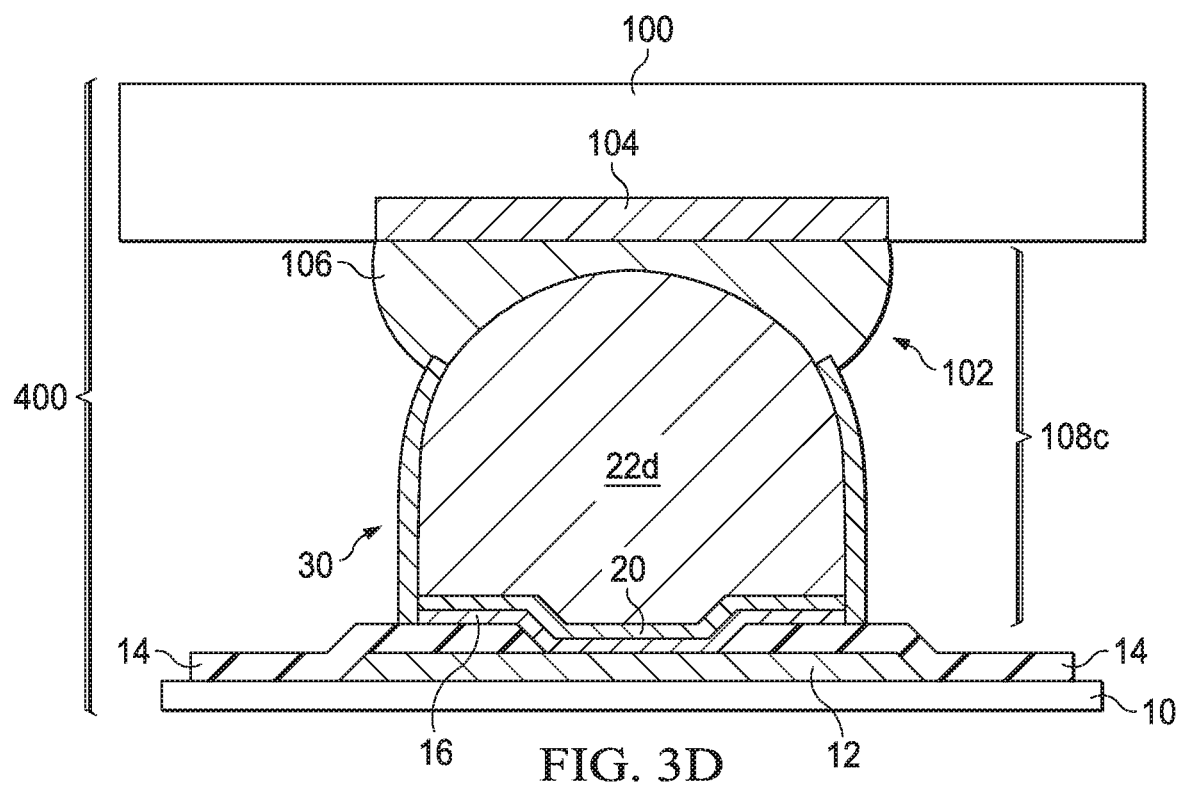

FIG. 3D is a cross-sectional diagram depicting an embodiment of a package assembly with the bump structure 30. After the formation of the bump structure 30, the substrate 10 may then be sawed and packaged to another substrate 100 through the connection structure 102 including a solder layer 106 on contact pads 104 and/or conductive traces. Using an exemplary coupling process, a joint-solder structure 108c is formed between the substrates 10 and 100. The substrate 10, the joint-solder layer 108c, and the other substrate 100 is referred to as a packaging assembly 400. It is discovered that the use of the metal cap layer 24 of the bump structure 30 maintains a more uniform stand off height in completed packages, and improved reliability of the semiconductor device.

FIGS. 4A-4E are cross-sectional views of a portion of a semiconductor device at various stages in a bump formation process in accordance with an embodiment. The explanation of the same or similar portions to the description in FIG. 1A to FIG. 1G will be omitted.

Figure 4A:
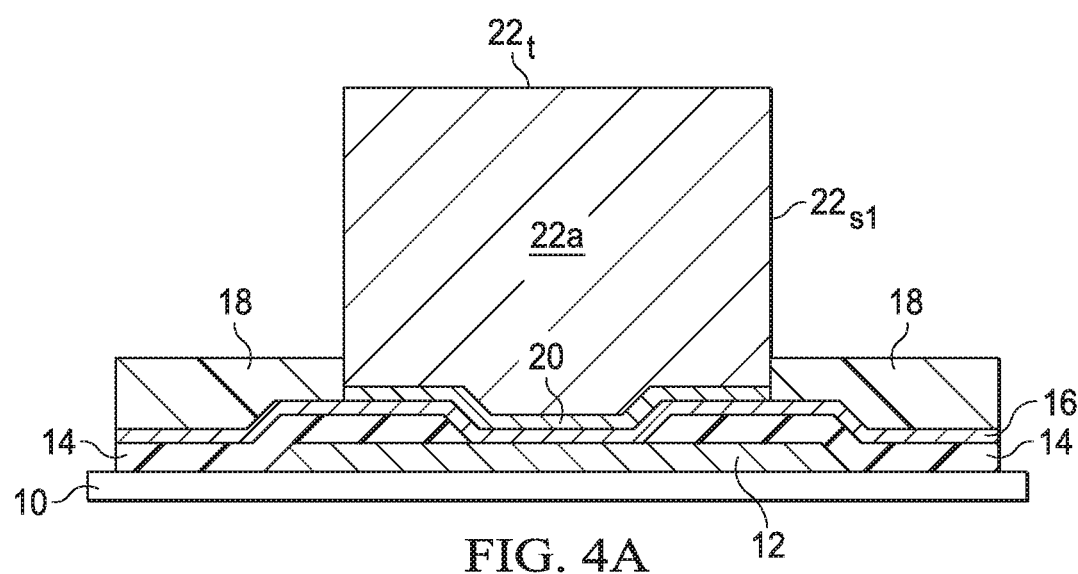
FIGS. 4A-4E are cross-sectional views of a portion of a semiconductor device at various stages in a bump formation process in accordance with an embodiment.

With reference to FIG. 4A, after the formation of the solder material layer 22 in the opening 18 of the mask layer 18, the mask layer 18 is partially removed to expose a portion of the solder pillar 22a, and a portion of the mask layer 18 remains at the lower portions of the solder pillar 22a. In one embodiment, the top surface 22t is exposed, and an upper portion of the sidewall surface $22s_1$ is exposed. For example, more than 50% (e.g., about 70%-80%) of the sidewall surface is exposed at this step.

Figure 4B:
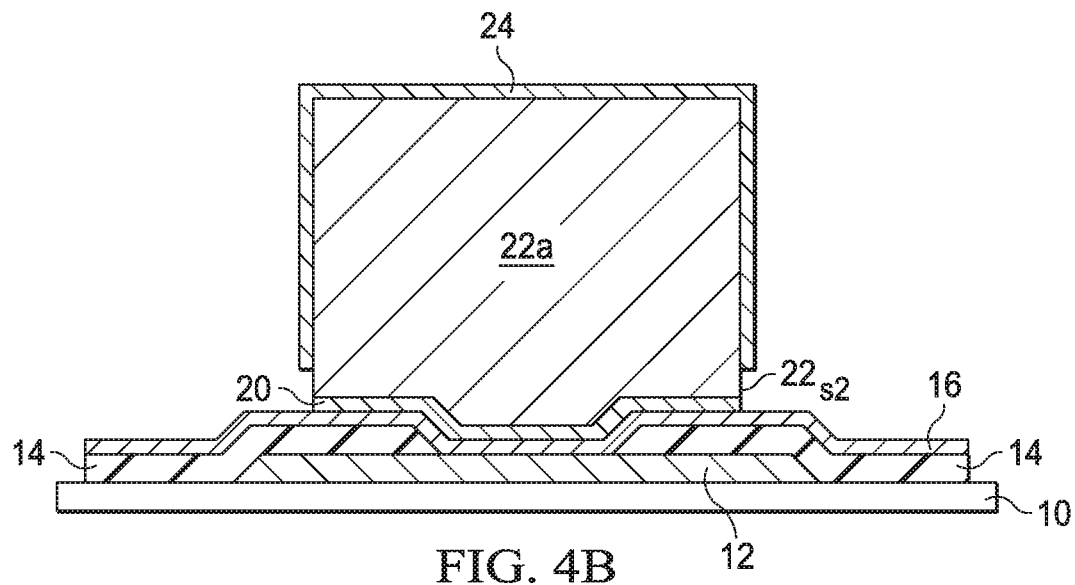

Next, as shown in FIG. 4B, a metal cap layer 24 is formed on the exposed surface of the solder pillar 22a by electro plating or electroless plating methods, followed by removing the remaining portion of the mask layer 18. That is, the metal cap layer 24 is formed on the uncovered surface of the solder pillar 22a, including the top surface 22t and the upper portion of the sidewall surface $22s_1$. After completely removing the mask layer 18, the lower portion of the sidewall surface $22s_2$ and the UBM layer 16 are exposed.

Figure 4C:
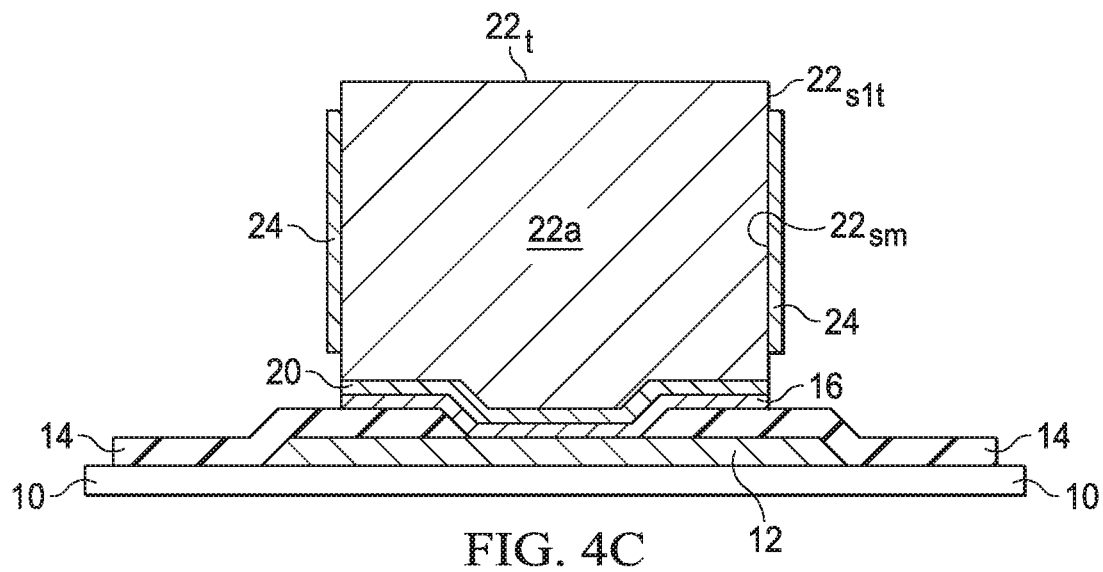

Next, as shown in FIG. 4C, an etching process, such as wet etching, dry etching or the like, is performed in order to remove the UBM layer 16 outside the solder pillar 22a till the passivation layer 14 is exposed. A portion of the metal cap layer 24 on the surface of the solder pillar 22a is also removed during the UBM etching step. In one embodiment, a portion of the metal cap layer 24 on the top of the solder pillar 22a is removed to expose the top surface 22t. In some embodiments, a portion of the metal cap layer 24 on to the top of the upper portion sidewall of the solder pillar 22a is removed to expose the top sidewall surface $22s_{1t}$. The metal cap layer 24 remains on the middle sidewall surface 22sm of the solder pillar 22a.

Figure 4D:
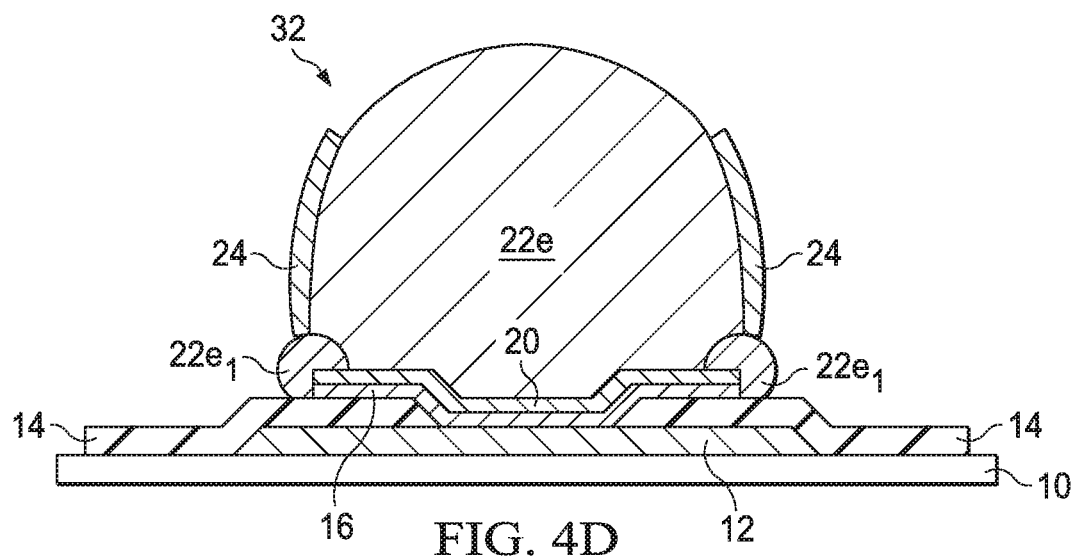

FIG. 4D depicts a thermal reflow process performed on the solder pillar 22a, forming an ovoid-shaped solder bump 22e. Because the metal cap layer 24 has a higher melting point than the solder material, the bump shape is laterally spread at the bottom portion $22e_1$ that is outside the metal cap layer 24. The bottom portion $22e_1$ provides several advantages, e.g., providing an additional stress relief feature, further promoting adhesion of the solder bump with the underlying materials, as well as providing a mechanical stress relief. During thermal cycling, the metal elements of the metal cap layer 24 may diffuse into the solder bump 22e, and an intermetallic compound (IMC) layer may be formed between the solder bump 22e and the metal cap layer 24.

This completes a bump structure 32 including the UBM layer 16, the optional metallization layer 20, the solder bump 22e and the metal cap layer 24. The metal cap layer 24 causes the solder bump 22e to act as a spring or act like an air filled balloon when subsequently pushed against a substrate. The metal cap layer 24 acts as a hard stop to make the bump structure 28a maintain a more uniform stand off height in completed packages. The shorting and bridging problems are therefore reduced or eliminated.

Figure 4E:
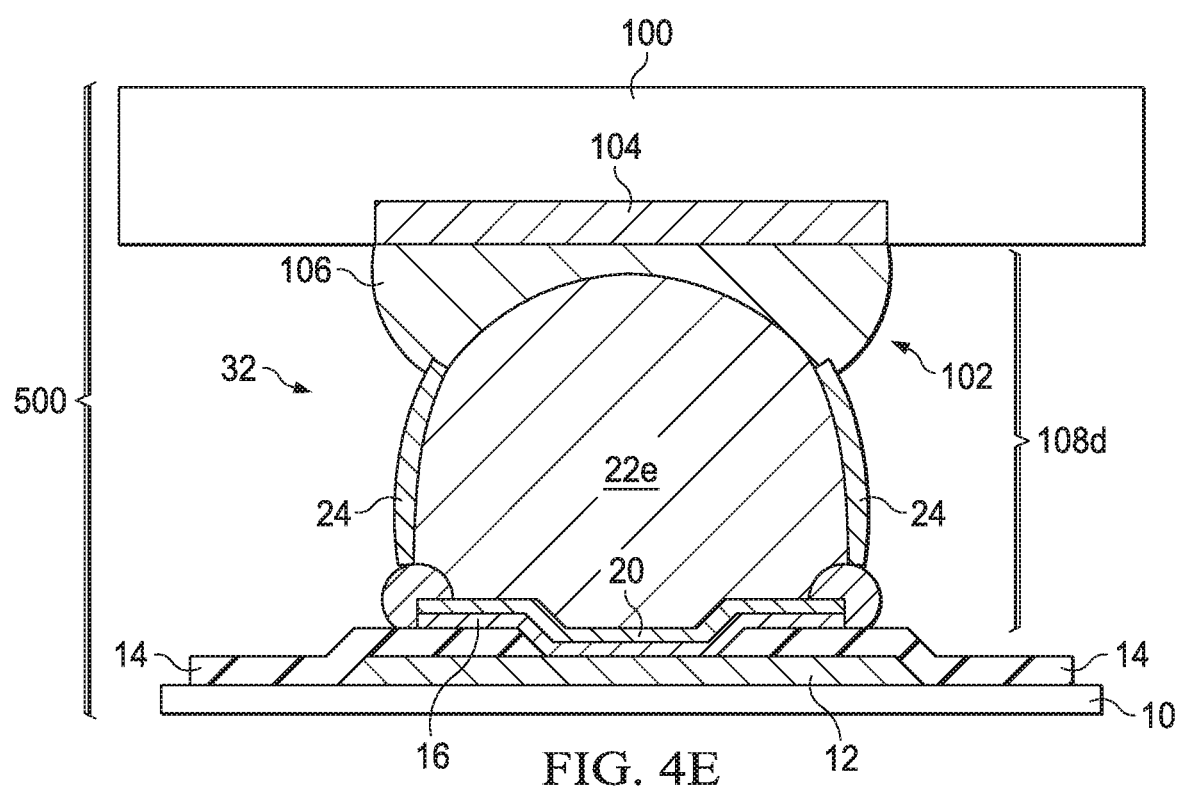

FIG. 4E is a cross-sectional diagram depicting an embodiment of a package assembly with the bump structure 32. After the formation of the bump structure 32, the substrate 10 may then be sawed and packaged to another substrate 100 through the connection structure 102 including a solder layer 106 on contact pads 104 and/or conductive traces. Using an exemplary coupling process, a joint-solder structure 108d is formed between the substrates 10 and 100. The substrate 10, the joint-solder layer 108d, and the other substrate 100 is referred to as a packaging assembly 500. It is discovered that the use of the metal cap layer 24 of the bump structure 32 maintains a more uniform stand off height in completed packages, and improved reliability of the semiconductor device.

A representative method of forming a packaging assembly includes a step of disposing a bump structure between a semiconductor substrate and a package substrate, where the bump structure electrically connects the semiconductor substrate to the package substrate. The bump structure comprises a solder bump. A metal cap layer covers at least a portion of the solder bump, while a top portion of the solder bump remains exposed. The metal cap layer has a melting temperature greater than a melting temperature of the solder bump. The metal cap layer may comprise at least one of nickel, palladium, and gold. The metal cap layer may comprise copper. The solder bump may comprise a lead-free solder material. The method may further comprise a step of forming the metal cap layer on a middle sidewall surface of the solder bump. The method may further comprise a step of forming the metal cap layer on a lower sidewall surface of the solder bump and covering a bottom portion of the solder bump.

Another representative method of forming a semiconductor device includes a step of forming a solder material layer over a semiconductor substrate. The solder material layer comprises a substantially homogenous material. A metal cap layer is conformally formed over the solder material layer. A portion of the metal cap layer is removed to expose at least a top portion of the solder material layer, while a remaining portion of the metal cap layer covers at least a portion of the solder material layer. A thermal reflow of the solder material layer is performed, wherein the metal cap layer has a melting temperature that is greater than a melting temperature of the solder material layer. Removal of a portion of the metal cap layer may further comprise removing another portion of the metal cap layer to expose a bottom portion of the solder material layer. Forming the solder material layer over the semiconductor substrate may further comprise forming a pillar on the semiconductor substrate. The thermal reflow may comprise formation of a solder bump on the semiconductor substrate. Forming the solder material layer may further comprise forming a lead free solder layer.

Yet another representative method of forming a semiconductor device includes steps of forming a pad region on a semiconductor substrate, and connecting a solder bump to the pad region. A metal cap layer is formed over at least a portion of the solder bump, wherein the metal cap layer has a first melting temperature greater than a second melting temperature of the solder bump. A top portion of the solder bump is exposed. The method may further comprise a step of reflowing the solder bump. The metal cap layer may comprise nickel. The metal cap layer may comprise palladium or gold. The metal cap layer may comprise copper. The solder bump may comprise a lead-free solder material. The metal cap layer may be formed on a middle sidewall surface of the solder bump. The solder bump may have a bottom portion disposed outside lateral extents of the metal cap layer. The metal cap layer may be formed on a lower sidewall surface of the solder bump, with the metal cap layer extending to a bottom portion of the solder bump.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of concepts as expressed herein.

What is claimed is:

1. A semiconductor package comprising:
   a first substrate;
   a pad region over the first substrate;
   a passivation layer over the first substrate and covering a first portion of the pad region;
   an under-bump-metallurgy (UBM) layer extending through the passivation layer and electrically coupled to the pad region;
   a solder bump on the UBM layer; and
   a metal cap layer extending along at least portions of sidewalls of the solder bump, the metal cap layer comprising a first material, and the solder bump comprising a second material different from the first material, wherein a bottom portion of the solder bump contacts the UBM layer and extends beyond exterior sidewalls of the metal cap layer facing away from the solder bump, wherein exterior sidewalls of the bottom portion of the solder bump are curved and are exposed by the metal cap layer, wherein an upper surface of the solder bump distal from the first substrate is free of the first material.

2. The semiconductor package of claim 1, wherein the metal cap layer has a higher melting temperature than the solder bump.

3. The semiconductor package of claim 2, wherein the metal cap layer comprises copper, nickel, gold, silver, palladium, indium, nickel-palladium-gold, nickel-gold, or alloys thereof.

4. The semiconductor package of claim 2, wherein the metal cap layer comprises indium, platinum, cobalt, vanadium, or alloys thereof.

5. The semiconductor package of claim 1, further comprising:
   a second substrate; and
   a solder region between the second substrate and the solder bump.

6. A semiconductor package comprising:
   a first substrate having a pad region at a first surface of the first substrate;
   a second substrate having a contact pad at a second surface of the second substrate facing the first substrate; and
   a bump structure between the pad region and the contact pad, the bump structure comprising:

a solder pillar, wherein a bottom surface of the solder pillar is bonded to the pad region, and a top surface of the solder pillar extends away from the pad region;
a solder region between the top surface of the solder pillar and the contact pad; and
a metal cap layer comprising a metal material and extending along at least portions of sidewalls of the solder pillar, wherein the metal cap layer has a higher melting temperature than the solder pillar, wherein a bottom portion of the solder pillar proximate to the pad region extends beyond exterior sidewalls of the metal cap layer facing away from the solder pillar, wherein exterior sidewalls of the bottom portion of the solder pillar are curved and free of the metal material, wherein the top surface of the solder pillar is free of the metal material.

7. The semiconductor package of claim 6, further comprising:
a passivation layer over the first substrate and over the pad region; and
an under-bump-metallurgy (UBM) layer that extends along an upper surface of the passivation layer, through an opening of the passivation layer, and electrically coupled to the pad region, wherein the UBM layer is between the pad region and the solder pillar.

8. A semiconductor package comprising:
a semiconductor substrate;
a pad region over the semiconductor substrate;
a passivation layer over the pad region and covering perimeter portions of the pad region;
a solder bump over the pad region, wherein a lower surface of the solder bump is bonded to the pad region, and an upper surface of the solder bump is curved and extends away from the semiconductor substrate; and
a metal cap layer extending along sidewalls of the solder bump, wherein the metal cap layer is a conformal layer of a first metal material and has a higher melting temperature than the solder bump, wherein lower sidewalls of the solder bump proximate to the lower surface of the solder bump are curved and free of the first metal material, wherein the lower sidewalls of the solder bump extend beyond exterior sidewalls of the metal cap layer facing away from the solder bump, wherein the upper surface of the solder bump is free of the first metal material.

9. The semiconductor package of claim 8, wherein the metal cap layer covers upper sidewalls of the solder bump proximate to the upper surface of the solder bump.

10. The semiconductor package of claim 1, wherein the UBM layer has a lower surface facing the pad region, an upper surface facing away from the pad region, and sidewalls connecting the lower surface and the upper surface, wherein the bottom portion of the solder bump extends along and covers the sidewalls of the UBM layer.

11. The semiconductor package of claim 10, further comprising a metallization layer between the UBM layer and the solder bump, wherein the bottom portion of the solder bump extends along and covers sidewalls of the metallization layer.

12. The semiconductor package of claim 7, wherein the bottom portion of the solder pillar extends continuously from a lower surface of the metal cap layer facing the first substrate to the passivation layer.

13. The semiconductor package of claim 5, wherein the solder region contacts and extends along the upper surface of the solder bump.

14. The semiconductor package of claim 13, wherein the solder region contacts and extends along the exterior sidewalls of the metal cap layer.

15. The semiconductor package of claim 14, wherein the exterior sidewalls of the metal cap layer are curved and intersect the exterior sidewalls of the bottom portion of the solder bump.

16. The semiconductor package of claim 15, wherein a radius of the exterior sidewalls of the metal cap layer is larger than that of the exterior sidewalls of the bottom portion of the solder bump.

17. The semiconductor package of claim 8, wherein the exterior sidewalls of the metal cap layer are curved and intersect the lower sidewalls of the solder bump.

18. The semiconductor package of claim 5, wherein the solder region contacts the upper surface of the solder bump and extends continuously from the upper surface of the solder bump to the second substrate.

19. The semiconductor package of claim 6, wherein the solder region contacts the top surface of the solder pillar and extends continuously from the top surface of the solder pillar to the contact pad of the second substrate.

20. The semiconductor package of claim 8, further comprising:
a second substrate having a contact pad at a first side of the second substrate facing the semiconductor substrate; and
a solder region between the contact pad and the solder bump, wherein the solder region contacts the upper surface of the solder bump and extends continuously from the upper surface of the solder bump to the contact pad.

* * * * *